United States Patent
Chiba et al.

(10) Patent No.: US 11,923,790 B2
(45) Date of Patent: Mar. 5, 2024

(54) DIELECTRIC ELASTOMER DRIVE SYSTEM AND DIELECTRIC ELASTOMER DRIVE METHOD

(71) Applicants: Seiki Chiba, Tokyo (JP); Mikio Waki, Sakura (JP); ZEON CORPORATION, Tokyo (JP)

(72) Inventors: Seiki Chiba, Tokyo (JP); Mikio Waki, Sakura (JP); Mitsuaki Ito, Ageo (JP); Makoto Sawada, Ageo (JP)

(73) Assignees: Seiki Chiba, Tokyo (JP); Mikio Waki, Sakura (JP); ZEON CORPORATION, Tokyo (JP)

( * ) Notice: Subject to any disclaimer, the term of this patent is extended or adjusted under 35 U.S.C. 154(b) by 239 days.

(21) Appl. No.: 17/415,729

(22) PCT Filed: Dec. 21, 2018

(86) PCT No.: PCT/JP2018/047266
§ 371 (c)(1),
(2) Date: Jun. 18, 2021

(87) PCT Pub. No.: WO2020/129239
PCT Pub. Date: Jun. 25, 2020

(65) Prior Publication Data
US 2022/0085735 A1    Mar. 17, 2022

(51) Int. Cl.
*H02N 1/06*    (2006.01)
*H02N 1/00*    (2006.01)

(52) U.S. Cl.
CPC .................. *H02N 1/006* (2013.01)

(58) Field of Classification Search
CPC .............................. H02N 1/006; H02N 2/186
USPC .......................................................... 310/300
See application file for complete search history.

(56) References Cited

U.S. PATENT DOCUMENTS

| | | | |
|---|---|---|---|
| 7,557,456 B2* | 7/2009 | Kornbluh | F03B 13/1845 310/307 |
| 9,543,776 B2* | 1/2017 | Bauer | H02M 3/158 |
| 2001/0032663 A1 | 10/2001 | Pelrine et al. | |
| 2002/0175594 A1 | 11/2002 | Kornbluh et al. | |

(Continued)

FOREIGN PATENT DOCUMENTS

| | | |
|---|---|---|
| JP | 2005260236 A | 9/2005 |
| JP | 2009124875 A | 6/2009 |

(Continued)

OTHER PUBLICATIONS

Jun. 8, 2022, the Extended European Search Report issued by the European Patent Office in the corresponding European Patent Application No. 18943616.5.

(Continued)

*Primary Examiner* — Burton S Mullins
(74) *Attorney, Agent, or Firm* — KENJA IP LAW PC

(57) ABSTRACT

A dielectric elastomer drive system A1 includes: a dielectric elastomer drive unit 1 provided with a dielectric elastomer layer 11 and a pair of electrode layers 12 flanking the dielectric elastomer layer 11; a power supply unit 5 configured to apply voltage to the dielectric elastomer drive unit 1; and a charge removal unit 2 configured to remove the charge stored in the dielectric elastomer drive unit 1. The configuration contributes to improving responsiveness.

8 Claims, 9 Drawing Sheets

(56) References Cited

U.S. PATENT DOCUMENTS

| | | |
|---|---|---|
| 2005/0200238 A1 | 9/2005 | Park et al. |
| 2008/0218132 A1 | 9/2008 | Pelrine et al. |
| 2009/0127979 A1 | 5/2009 | Takeuchi et al. |
| 2014/0013938 A1* | 1/2014 | Aoki ..................... F16J 15/164 |
| | | 92/163 |
| 2014/0145550 A1* | 5/2014 | Hitchcock .............. H10N 30/30 |
| | | 310/300 |
| 2020/0252010 A1 | 8/2020 | Chiba et al. |

FOREIGN PATENT DOCUMENTS

| | | |
|---|---|---|
| JP | 2014507930 A | 3/2014 |
| JP | 2019005981 A | 1/2019 |
| WO | 2014202687 A1 | 12/2014 |
| WO | 2018163854 A1 | 9/2018 |

OTHER PUBLICATIONS

Feb. 26, 2016, International Search Report issued in the International Patent Application No. PCT/JP2018/047266.
Jul. 18, 2023, Communication pursuant to Article 94(3) EPC issued by the European Patent Office in the corresponding European Patent Application No. 18943616.5.

* cited by examiner

— Related Art —

DIELECTRIC ELASTOMER DRIVE SYSTEM AND DIELECTRIC ELASTOMER DRIVE METHOD

TECHNICAL FIELD

The present invention relates to a dielectric elastomer drive system and a dielectric elastomer drive method.

BACKGROUND ART

There has been proposed a dielectric elastomer drive system using a dielectric elastomer drive unit that includes a dielectric elastomer layer and a pair of flexible electrode layers flanking the dielectric elastomer layer (see Patent Document 1, for example). FIG. 11 shows an example of a conventional dielectric elastomer drive system. When voltage is applied to a pair of electrode layers 912 from a power supply unit 92 in a dielectric elastomer drive system X, the pair of electrode layers 912 are attracted to each other by Coulomb force. This reduces the thickness of a dielectric elastomer layer 911 having significant flexibility, and increases the dimension in a planar direction. As a result, the dielectric elastomer drive unit 91 is placed in a contracted state. An elongated state resulting from the application of voltage and a contracted state resulting from stopping the application of voltage can be freely selected by employing a method such as pre-elongating the dielectric elastomer drive unit 91. This makes it possible to drive the dielectric elastomer drive unit 91.

The dielectric elastomer drive unit 91 is elongated very quickly in response to the application of voltage, and is therefore attracting attention as a drive unit having excellent responsiveness. However, the pair of electrode layers 912 flanking the dielectric elastomer layer 911 electrically constitute a capacitor. When voltage is applied to the pair of electrode layers 912 to elongate the dielectric elastomer drive unit 91, a charge is stored in the pair of electrode layers 912. The charge remains in the capacitor and does not disappear spontaneously. The charge stored in the pair of electrode layers 912 hinders improvement of the contraction speed of the dielectric elastomer drive unit 91 as compared to the elongation speed of the dielectric elastomer drive unit 91.

PRIOR ART DOCUMENT

Patent Document

Patent Document 1: JP-A-2009-124875

SUMMARY OF THE INVENTION

Problem to be Solved by the Invention

The present invention has been conceived in view of the circumstances noted above, and aims to provide a dielectric elastomer drive system and a dielectric elastomer drive method that are capable of improving responsiveness.

Means to Solve the Problem

According to the present invention, there is provided a dielectric elastomer drive system that comprises: a dielectric elastomer drive unit including a dielectric elastomer layer and a pair of electrode layers flanking the dielectric elastomer layer; a power supply unit that applies voltage to the dielectric elastomer drive unit; and a charge removal unit that removes a charge stored in the dielectric elastomer drive unit.

In a preferred embodiment of the present invention, the dielectric elastomer drive system further includes a main switch unit that opens or closes the connection between the dielectric elastomer drive unit and the charge removal unit.

In a preferred embodiment of the present invention, the dielectric elastomer drive system further includes a power-supply-side switch unit that opens or closes the connection between the dielectric elastomer drive unit and the power supply unit.

In a preferred embodiment of the present invention, the charge removal unit converts the charge stored in the dielectric elastomer drive unit to thermal energy.

In a preferred embodiment of the present invention, the main switch unit opens or closes the connection between the charge removal unit and a wiring path connecting the power supply unit and the dielectric elastomer drive unit.

In a preferred embodiment of the present invention, the main switch unit switches between a first state in which the dielectric elastomer drive unit is connected to the power supply unit and a second state in which the dielectric elastomer drive unit is connected to the charge removal unit.

In a preferred embodiment of the present invention, the charge removal unit temporarily stores the charge in the dielectric elastomer drive unit.

In a preferred embodiment of the present invention, the dielectric elastomer drive system further includes a power storage unit that stores a charge temporarily stored in the charge removal unit.

In a preferred embodiment of the present invention, the dielectric elastomer drive system further includes a sub-switch unit that opens or closes the connection between the charge removal unit and the power storage unit.

In a preferred embodiment of the present invention, the state of the main switch unit is changed by elongation and contraction of the dielectric elastomer drive unit. The main switch unit connects the dielectric elastomer drive unit and the charge removal unit to each other when the dielectric elastomer drive unit is elongated by application of voltage. The main switch unit connects the dielectric elastomer drive unit and the power supply unit to each other when the dielectric elastomer drive unit is contracted by no application of voltage.

A method for driving a dielectric elastomer, provided by a second aspect of the present invention, comprises: applying voltage to a dielectric elastomer drive unit including a dielectric elastomer layer and a pair of electrode layers flanking the dielectric elastomer layer; stopping application of voltage to the dielectric elastomer drive unit; and removing, with use of a charge removal unit, the charge stored in the dielectric elastomer drive unit.

Advantages of the Invention

According to the present invention, it is possible to improve the responsiveness of the dielectric elastomer drive system.

Other features and advantages of the present invention will be more apparent from detailed description given below with reference to the accompanying drawings.

MODE FOR CARRYING OUT THE INVENTION

Preferred embodiments of the present invention are described in detail below with reference to the accompanying drawings.

First Embodiment

Figure 1:
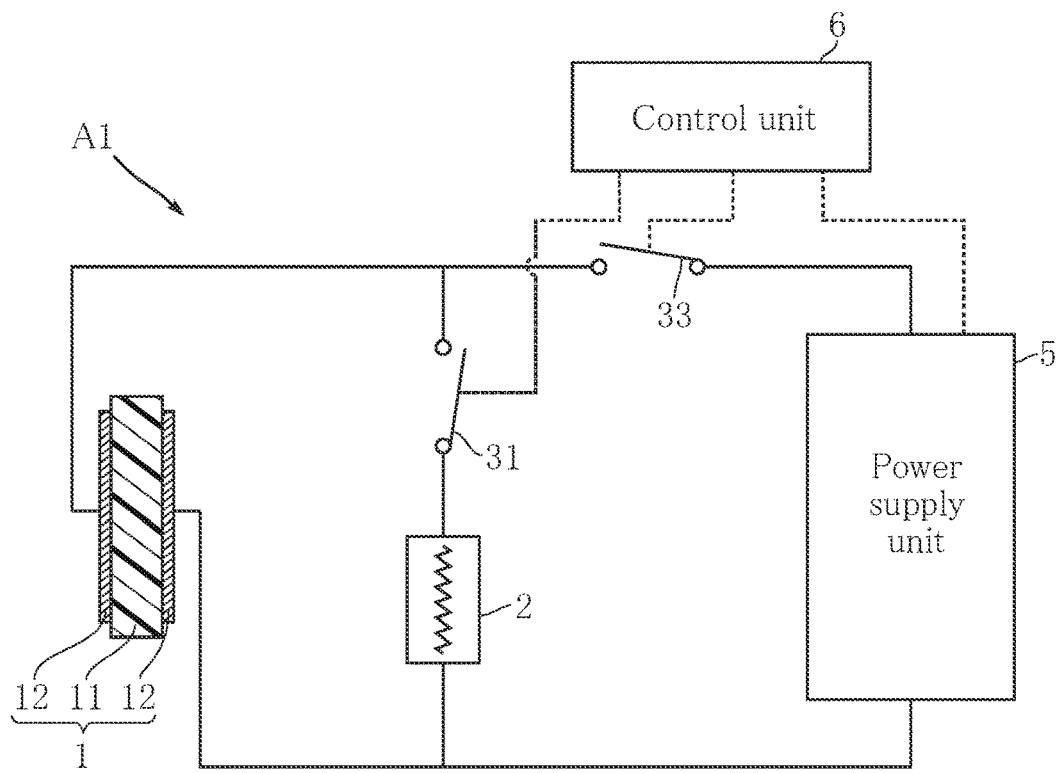
FIG. 1 is a system configuration diagram showing a dielectric elastomer drive system according to a first embodiment of the present invention.

FIG. 1 shows a dielectric elastomer drive system according to a first embodiment of the present invention. A dielectric elastomer drive system A1 according to the present embodiment includes a dielectric elastomer drive unit 1, a charge removal unit 2, a main switch unit 31, a switch unit 33, a power supply unit 5, and a control unit 6.

The dielectric elastomer drive unit 1 outputs a driving force in the dielectric elastomer drive system A1. The dielectric elastomer drive unit 1 has a dielectric elastomer layer 11 and a pair of electrode layers 12.

The dielectric elastomer layer 11 is required to be elastically deformable and to have high insulating strength. Some preferable examples of the material of the dielectric elastomer layer 11 include, but not limited to, silicone elastomers and acrylic elastomers.

The pair of electrode layers 12, to which voltage is applied by the power supply unit 5, flank the dielectric elastomer layer 11. The electrode layers 12 are made of a conductive material that is elastically deformable following the elastic deformation of the dielectric elastomer layer 11. Such a material may be obtained by mixing an elastically deformable main material with a filler that provides conductivity. The filler may preferably be a carbon nanotube, for example.

When the dielectric elastomer drive unit 1 is not subjected to any external force or restraint, and is in a state where no voltage is applied by the power supply unit 5, the dielectric elastomer drive unit 1 is in a natural length state where no voluntary elongation or contraction has occurred. When the dielectric elastomer drive unit 1 is subjected to an external force, the dielectric elastomer layer 11 can elastically deform. When voltage is applied by the power supply unit 5, positive and negative charges are stored in the pair of electrode layers 12 with the dielectric elastomer layer 11 therebetween. The Coulomb force of these charges cause the pair of electrode layers 12 to be attracted to each other, allowing the dielectric elastomer layer 11 to be compressed in the thickness direction. Due to the compression in the thickness direction, the dimension of the dielectric elastomer layer 11 in the planar direction is elongated. In this way, the dielectric elastomer drive unit 1 can behave in a manner that the dimension in the planar direction is elongated by application of voltage.

The dielectric elastomer layer 11 of the dielectric elastomer drive unit 1 may be pre-elongated so that the dielectric elastomer layer 11 is alternately and freely placed in an elongated state and in a contracted state opposite to the elongated state resulting from the application of voltage. When necessary, the dielectric elastomer drive unit 1 may be provided with a supporting mechanism (not shown) for maintaining the pre-elongated state. Alternatively, the dielectric elastomer drive unit 1 may be provided with an elastic member (not shown) for elongating the dielectric elastomer layer 11 when necessary.

The charge removal unit 2 removes the charge stored in the pair of electrode layers 12 of the dielectric elastomer drive unit 1, and is connected in parallel to the pair of electrode layers 12 in the illustrated example. The charge removal unit 2 is not limited to any specific configuration as long as it has a function of removing charges. In the present embodiment, the charge removal unit 2 is configured with a resistor.

The power supply unit 5 applies voltage to the pair of electrode layers 12 in order to drive the dielectric elastomer drive unit 1. The power supply unit 5 is not limited to any specific configuration, as long as it can apply a predetermined voltage to the pair of electrode layers 12 at a predetermined time by an instruction from the control unit 6.

The main switch unit 31 is provided in the conductive path between the pair of electrode layers 12 (the dielectric elastomer drive unit 1) and the charge removal unit 2, and opens or closes to establish or cut off the connection between the pair of electrode layers 12 (the dielectric elastomer drive unit 1) and the charge removal unit 2. The main switch unit 31 is not particularly limited to any specific configuration. For example, the main switch unit 31 may be a switch mechanism that mechanically operates or a semiconductor element such as a transistor as appropriate. In the present embodiment, the main switch unit 31 is opened or closed by an instruction from the control unit 6. In the present embodiment, the main switch unit 31 is configured to open or close to establish or cut off the connection between the charge removal unit 2 and a wiring path connecting the power supply unit 5 and the dielectric elastomer drive unit 1.

The switch unit 33 is provided in the conductive path between the pair of electrode layers 12 (the dielectric elastomer drive unit 1) and the power supply unit 5, and opens or closes to establish or cut off the connection between the pair of electrode layers 12 (the dielectric elastomer drive unit 1) and the power supply unit 5. The switch unit 33 corresponds to a power-supply-side switch unit. In the present embodiment, the switch unit 33 also functions to open or close to establish or cut off the connection between the charge removal unit 2 and the power supply unit 5. The switch unit 33 is not particularly limited to any specific configuration. For example, the switch unit 33 may be a switch mechanism that mechanically operates, or may be a semiconductor element such as a transistor as appropriate. In the present embodiment, the switch unit 33 is opened or closed by an instruction from the control unit 6.

The control unit 6 controls the application of voltage by the power supply unit 5 and the opening/closing operations of the main switch unit 31 and the switch unit 33, so that the dielectric elastomer drive system A1 is driven in a desirable manner. The control unit 6 is not limited to any specific configuration, and may include a CPU and a memory.

The charge removal unit 2, the power supply unit 5, the control unit 6, the main switch unit 31, and the switch unit 33 are not limited to being configured as independent units. For example, some of these units may be integrated into a single device as long as it can execute the respective functions of the units integrated therein. For example, the power supply unit 5 and the control unit 6 may be configured as an integrated power supply device. Alternatively, the power supply unit 5 and the charge removal unit 2 may be configured as an integrated device.

Figure 2:
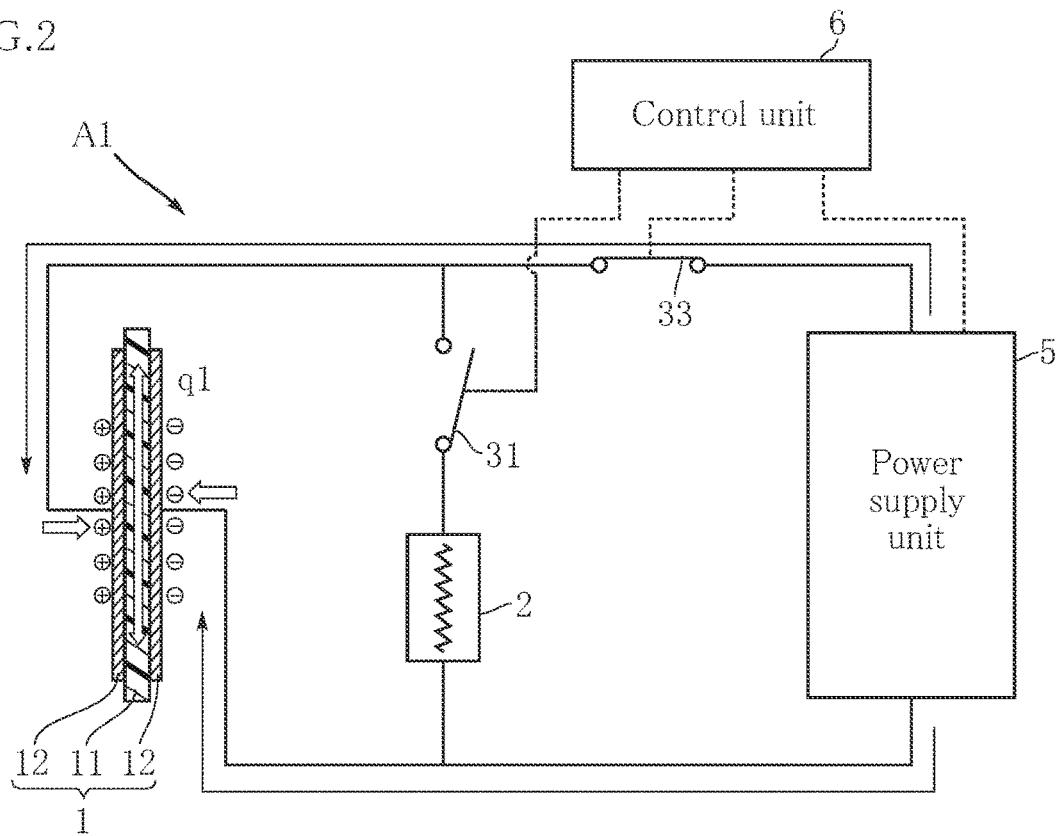
FIG. 2 is a system configuration diagram showing an operational example of the dielectric elastomer drive system according to the first embodiment of the present invention.
Figure 3:
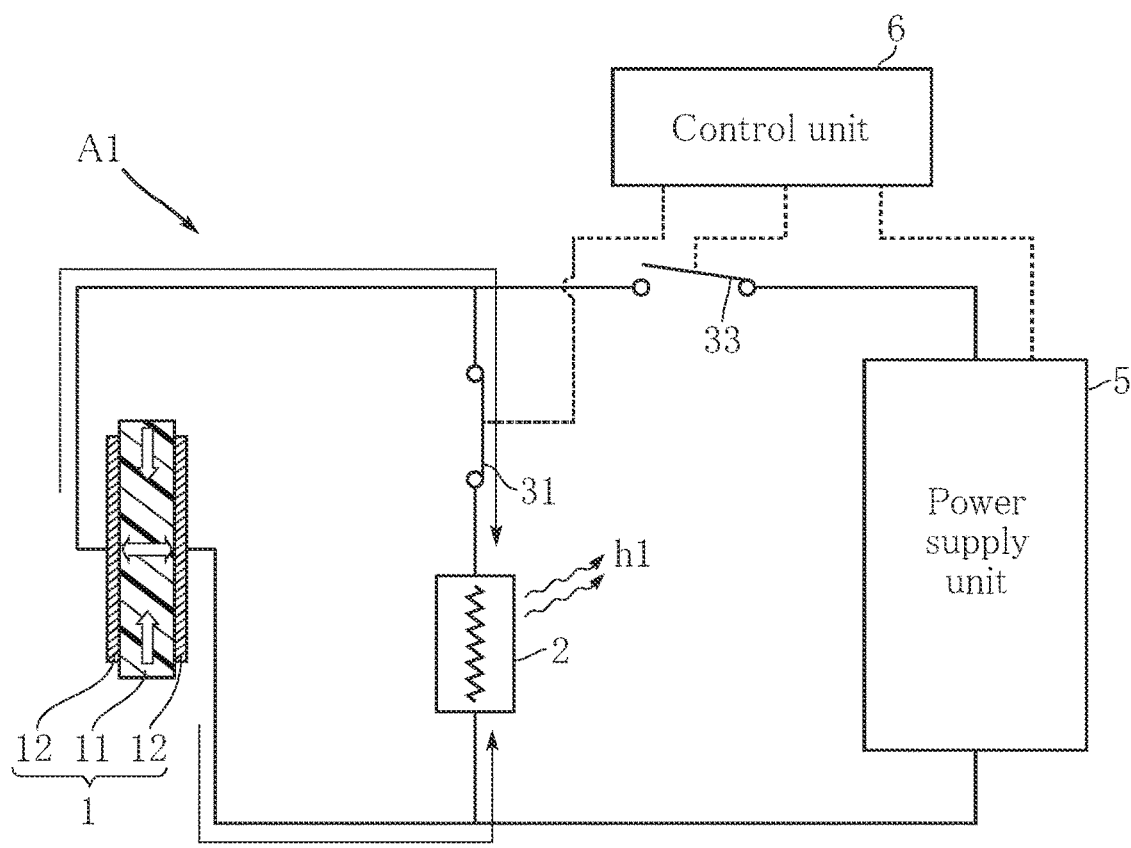
FIG. 3 is a system configuration diagram showing an operational example of the dielectric elastomer drive system according to the first embodiment of the present invention.

The following describes an operational example of the dielectric elastomer drive system A1 with reference to FIGS. 1 to 3.

In the state shown in FIG. 1, the main switch unit 31 and the switch unit 33 are opened by an instruction from the control unit 6. Accordingly, the dielectric elastomer drive unit 1, the charge removal unit 2, and the power supply unit 5 are not connected to each other, and no voltage is applied to the dielectric elastomer drive unit 1. In this state, the Coulomb force that attracts the pair of electrode layers 12 to each other is not generated, and the dielectric elastomer drive unit 1 is in a contracted state.

FIG. 2 shows the dielectric elastomer drive system A1 when the dielectric elastomer drive unit 1 is placed in an elongated state by an instruction from the control unit 6. The switch unit 33 is closed by an instruction from the control unit 6, whereby the pair of electrode layers 12 (the dielectric elastomer drive unit 1) and the power supply unit 5 are connected to each other. On the other hand, the main switch unit 31 is kept open, so that the pair of electrode layers 12 (the dielectric elastomer drive unit 1) and the charge removal unit 2 are not connected to each other. In this state, the power supply unit 5 applies voltage to the pair of electrode layers 12 by an instruction from the control unit 6. As such, a charge q1 is stored in the pair of electrode layers 12 to generate the Coulomb force. As a result, the dielectric elastomer layer 11 is contracted in the thickness direction and elongated in the planar direction, and the dielectric elastomer drive unit 1 is thus placed in an elongated state.

FIG. 3 shows the dielectric elastomer drive system A1 when the dielectric elastomer drive unit 1 in an elongated state as shown in FIG. 2 is placed in a contracted state again by an instruction from the control unit 6. The application of voltage by the power supply unit 5 is stopped by an instruction from the control unit 6. Furthermore, the switch unit 33 is opened and the main switch unit 31 is closed by an instruction from the control unit 6. As a result, the dielectric elastomer drive unit 1 and the power supply unit 5 are disconnected from each other, and the dielectric elastomer drive unit 1 and the charge removal unit 2 are connected to each other. This causes the charge q1 stored in the pair of electrode layers 12 to form an electric current and flow to the charge removal unit 2. Since the charge removal unit 2 is configured with a resistor in the present embodiment, the charge q1 forming a current is converted to thermal energy h1 by the charge removal unit 2. As a result, the charge q1 stored in the pair of electrode layers 12 of the dielectric elastomer drive unit 1 is removed by the charge removal unit 2. This causes the dielectric elastomer drive unit 1 to promptly return to the state where no voltage is applied and to be placed in a contracted state again.

In this way, the dielectric elastomer drive unit 1 in the dielectric elastomer drive system A1 outputs a drive force by appropriately repeating an elongated state and a contracted state as shown in FIGS. 2 and 3 by instructions from the control unit 6.

The following describes the advantages of the dielectric elastomer drive system A1.

When voltage is applied to the dielectric elastomer drive unit 1 to place the dielectric elastomer drive unit 1 in an elongated state as shown in FIG. 2, the charge q1 is stored in the pair of electrode layers 12. Since the dielectric elastomer drive unit 1 is a capacitor, the charge q1 stored in the pair of electrode layers 12 does not disappear spontaneously. When the charge q1 remains, the Coulomb force is generated that causes the pair of electrode layers 12 to be attracted to each other. As a result, the dielectric elastomer drive unit 1 may continue to be in the elongated state. Accordingly, even when the power supply unit 5 stops applying voltage to place the dielectric elastomer drive unit 1 to be in a contracted state from an elongated state, a prompt transition to the contracted state is hindered by the remaining charge q1.

In the present embodiment, the dielectric elastomer drive unit 1 is connected to the charge removal unit 2. The charge removal unit 2 functions to remove the charge q1 stored in the dielectric elastomer drive unit 1. Accordingly, as shown in FIG. 3, when the power supply unit 5 stops applying voltage and the charge removal unit 2 removes the charge q1 of the dielectric elastomer drive unit 1, the dielectric elastomer drive unit 1 can promptly transition from an elongated state to a contracted state. This improves the responsiveness of the dielectric elastomer drive system A1.

The dielectric elastomer drive system A1 includes the main switch unit 31. In the transition to an elongated state as shown in FIG. 2, the main switch unit 31 is opened, whereby the voltage for the dielectric elastomer drive unit 1 is prevented from being applied to the charge removal unit 2. In the transition to a contracted state as shown in FIG. 3, the main switch unit 31 is closed, whereby the dielectric elastomer drive unit 1 and the charge removal unit 2 are connected to each other and the charge removal unit 2 removes the charge q1 stored in the dielectric elastomer drive unit 1. This is preferable for improving the responsiveness of the dielectric elastomer drive system A1 and suppressing an undesired loss.

In the present embodiment, the charge removal unit 2 is configured with a resistor. The charge removal unit 2 configured with a resistor converts a passing current (charge q1) to the thermal energy h1 without delay. Such a configuration is suitable for the charge removal unit 2 to promptly remove the charge q1 of the dielectric elastomer drive unit 1.

FIGS. 4 to 10 show other embodiments of the present invention. In these figures, elements that are the same as or similar to those in the above embodiment are provided with the same reference signs as in the above embodiment.

Second Embodiment

Figure 4:
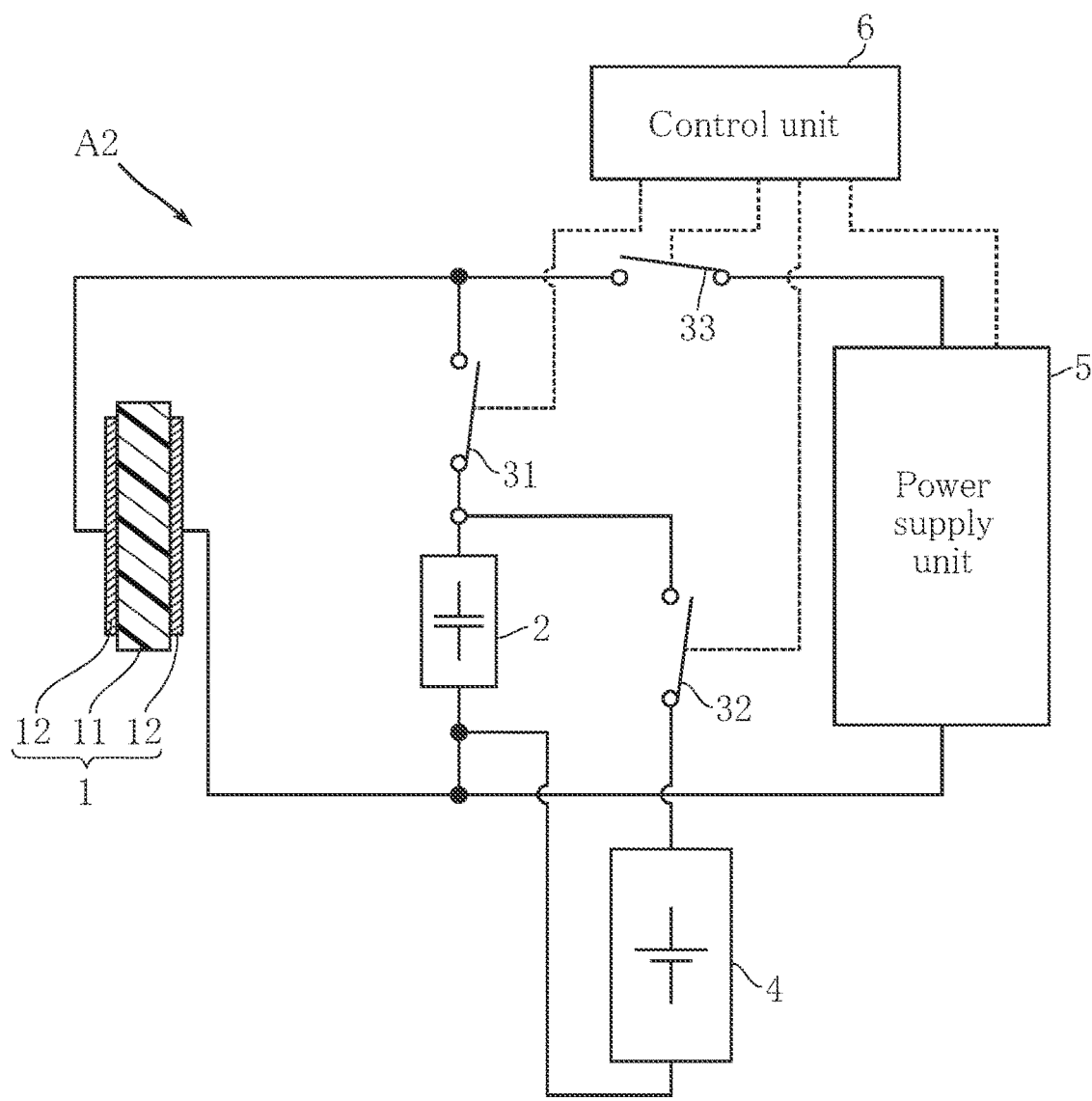
FIG. 4 is a system configuration diagram showing a dielectric elastomer drive system according to a second embodiment of the present invention.

FIG. 4 shows a dielectric elastomer drive system according to a second embodiment of the present invention. A dielectric elastomer drive system A2 according to the present embodiment is different from the above-described dielectric elastomer drive system A1 in the configuration of the charge removal unit 2, and further includes a sub-switch unit 32 and a power storage unit 4.

In the present embodiment, the charge removal unit 2 is configured with a capacitor, and functions to temporarily store the charge removed from the dielectric elastomer drive unit 1. The capacitor that constitutes the charge removal unit 2 is not limited to any specific configuration. From the viewpoint of effectively removing the charge stored in the pair of electrode layers 12 of the dielectric elastomer drive unit 1, the capacitance of the capacitor that constitutes the charge removal unit 2 is preferably sufficiently larger than the capacitance of the dielectric elastomer drive unit 1.

The power storage unit 4 stores, as electric energy, the charge temporarily stored in the charge removal unit 2, and is configured with a secondary battery such as a lithium-ion battery. The power storage unit 4 is selectively connected to the charge removal unit 2. In the present embodiment, the charge removal unit 2 may function as a step-down circuit that lowers the voltage for charging the power storage unit 4. In this case, the capacitance of the capacitor that constitutes the charge removal unit 2 may be selected such that the voltage applied to the power storage unit 4 has a desired value.

The sub-switch unit 32 is provided in the conductive path between the charge removal unit 2 and the power storage unit 4, and opens or closes to establish or cut off the connection between the charge removal unit 2 and the power storage unit 4. The sub-switch unit 32 is not particularly limited to any specific configuration. For example, the sub-switch unit 32 may be a switch mechanism that mechanically operates, or may be a semiconductor element such as a transistor as appropriate. In the present embodiment, the sub-switch unit 32 is opened or closed by an instruction from the control unit 6.

The following describes an operational example of the dielectric elastomer drive system A2 with reference to FIGS. 4 to 8.

In the state shown in FIG. 4, the main switch unit 31, the sub-switch unit 32, and the switch unit 33 are opened by an instruction from the control unit 6. Accordingly, the dielectric elastomer drive unit 1, the charge removal unit 2, the power storage unit 4, and the power supply unit 5 are not connected to each other, and no voltage is applied to the dielectric elastomer drive unit 1. In this state, the Coulomb force that attracts the pair of electrode layers 12 to each other is not generated, and the dielectric elastomer drive unit 1 is in a contracted state.

Figure 5:
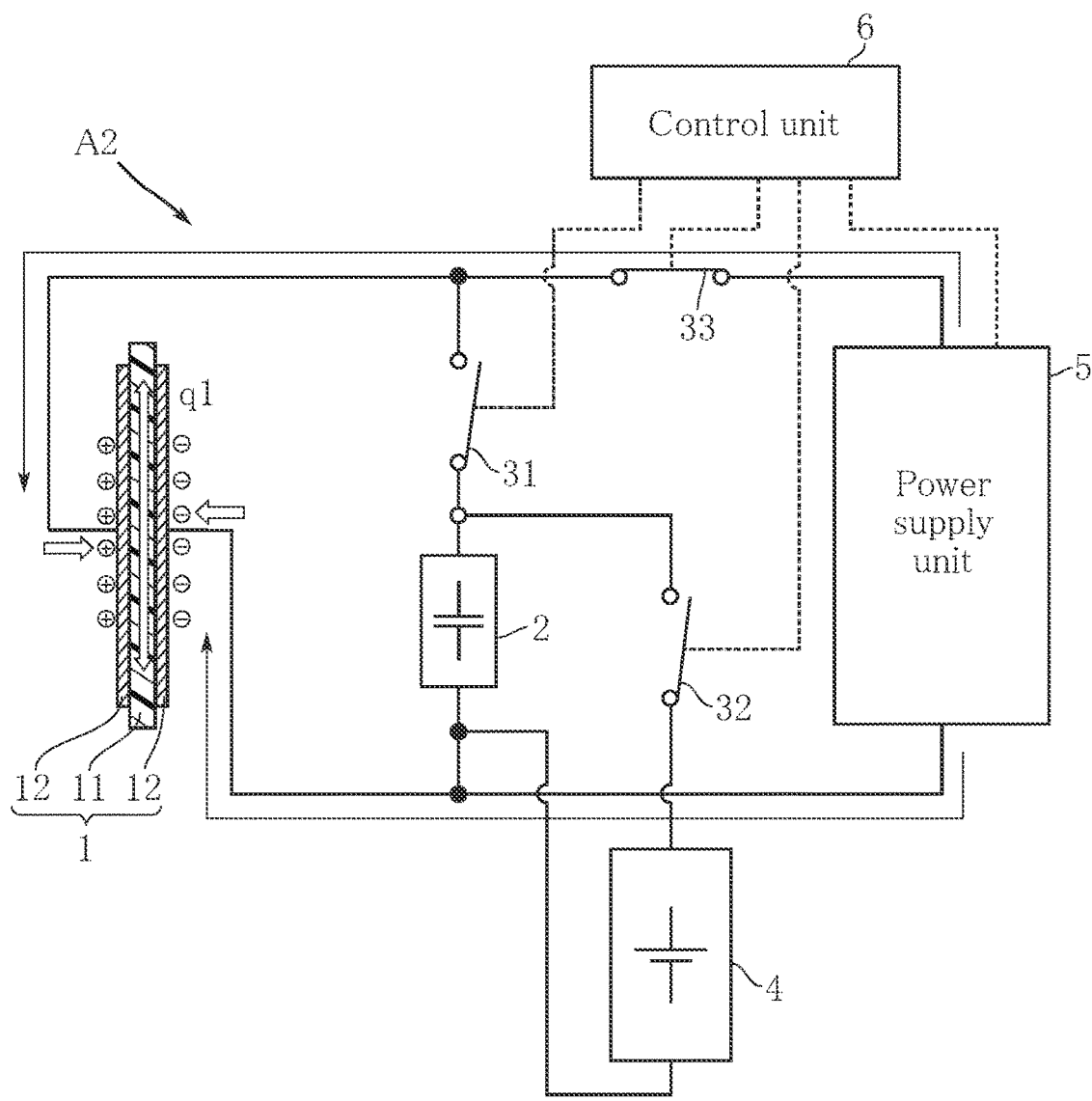
FIG. 5 is a system configuration diagram showing an operational example of the dielectric elastomer drive system according to the second embodiment of the present invention.

FIG. 5 shows the dielectric elastomer drive system A2 when the dielectric elastomer drive unit 1 is placed in an elongated state by an instruction from the control unit 6. The switch unit 33 is closed by an instruction from the control unit 6, whereby the pair of electrode layers 12 (the dielectric elastomer drive unit 1) and the power supply unit 5 are connected to each other. On the other hand, the main switch unit 31 and the sub-switch unit 32 are kept open. In this state, the power supply unit 5 applies voltage to the pair of electrode layers 12 by an instruction from the control unit 6. As such, a charge q1 is stored in the pair of electrode layers 12 to generate the Coulomb force. As a result, the dielectric elastomer layer 11 is contracted in the thickness direction and elongated in the planar direction, and the dielectric elastomer drive unit 1 is thus placed in an elongated state.

Figure 6:
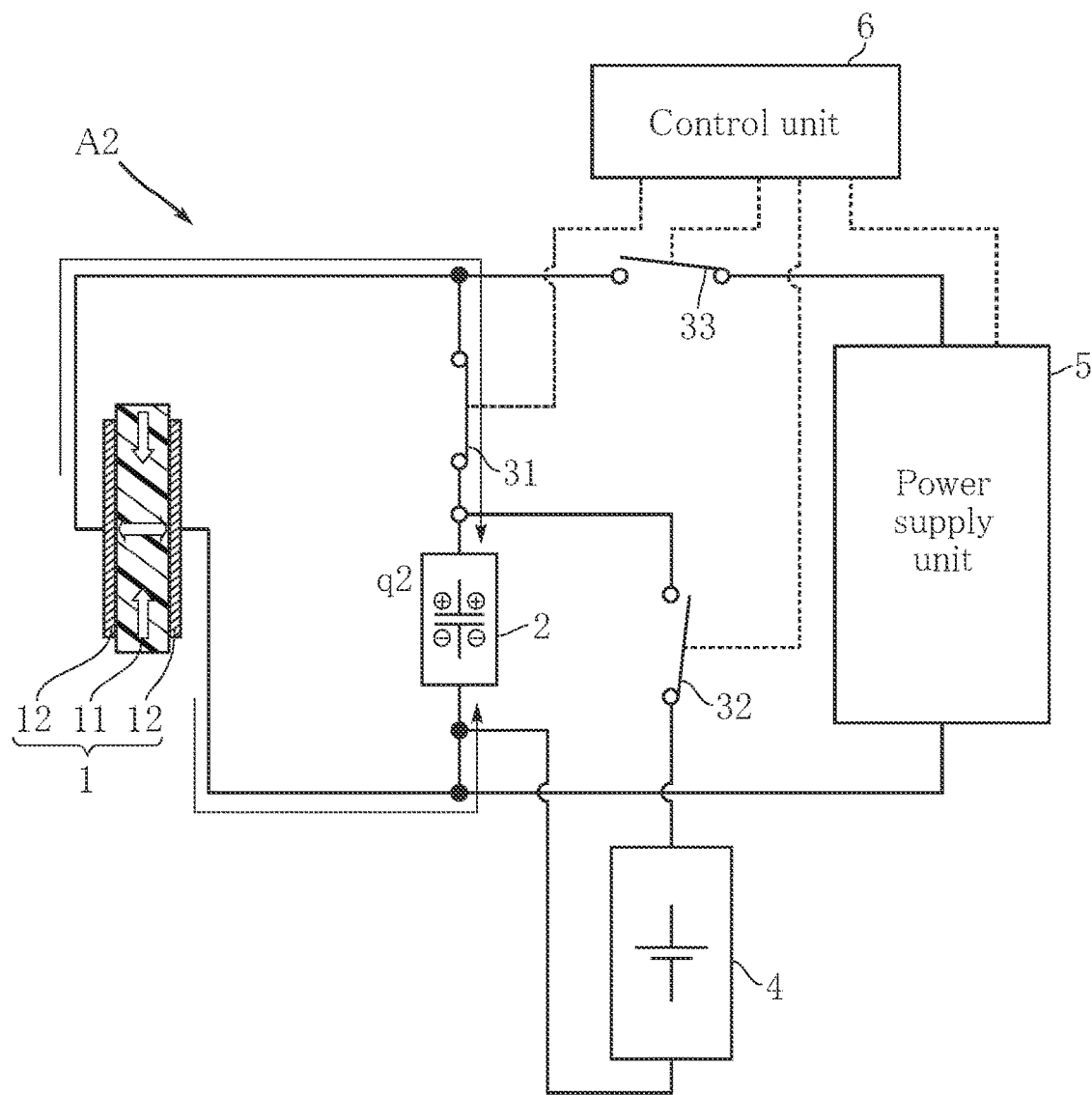
FIG. 6 is a system configuration diagram showing an operational example of the dielectric elastomer drive system according to the second embodiment of the present invention.

FIG. 6 shows the dielectric elastomer drive system A2 when the dielectric elastomer drive unit 1 in an elongated state as shown in FIG. 5 is placed in a contracted state again by an instruction from the control unit 6. The application of voltage by the power supply unit 5 is stopped by an instruction from the control unit 6. Furthermore, the switch unit 33 is opened and the main switch unit 31 is closed by an instruction from the control unit 6. As a result, the dielectric elastomer drive unit 1 and the power supply unit 5 are disconnected from each other, and the dielectric elastomer drive unit 1 and the charge removal unit 2 are connected to each other. This causes the charge q1 stored in the pair of electrode layers 12 to form an electric current and flow to the charge removal unit 2. The sub-switch unit 32 is kept open, so that the charge removal unit 2 and the power storage unit 4 are not connected to each other. In the present embodiment, the charge removal unit 2 is configured with a capacitor, so that the charge q1 forming a current is stored in the charge removal unit 2 as charge q2. When the loss in the conductive path from the dielectric elastomer drive unit 1 to the charge removal unit 2 is negligible, the quantity of the charge q1 is substantially the same as the quantity of the charge q2. As a result, the charge q1 stored in the pair of electrode layers 12 of the dielectric elastomer drive unit 1 is removed by the charge removal unit 2. This causes the dielectric elastomer drive unit 1 to promptly return to the state where no voltage is applied and to be placed in a contracted state again.

Figure 7:
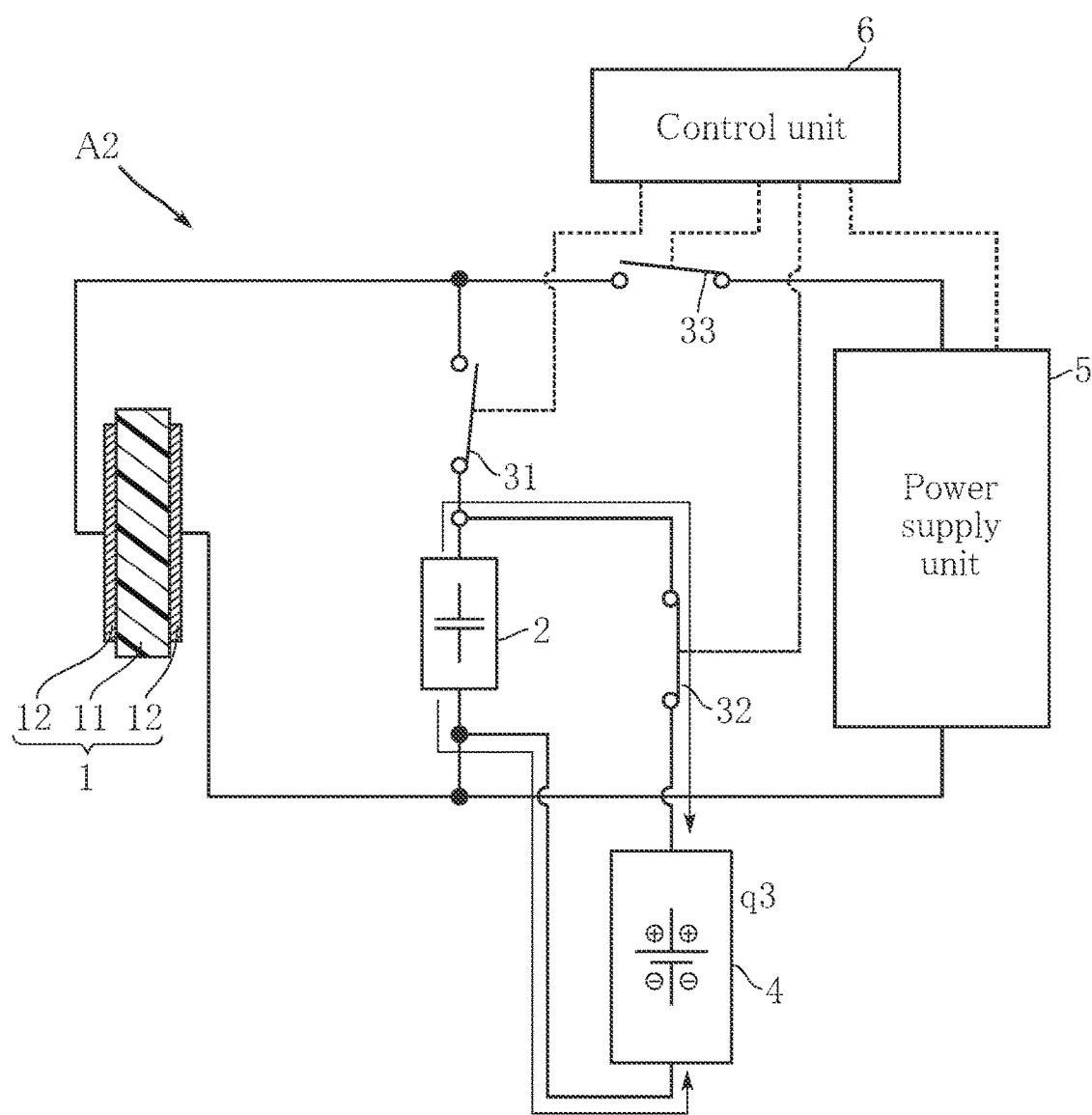
FIG. 7 is a system configuration diagram showing an operational example of the dielectric elastomer drive system according to the second embodiment of the present invention.

FIG. 7 shows the dielectric elastomer drive system A2 when the charge q2 in the charge removal unit 2 is stored in the power storage unit 4 by an instruction from the control unit 6. The main switch unit 31 is opened and the sub-switch unit 32 is closed by an instruction from the control unit 6. This causes the charge q2 stored in the charge removal unit 2 to form a current and flow to the power storage unit 4. As a result, electric energy corresponding to charge q3 is stored in the power storage unit 4. Note that the quantity of charge q3 is less than the quantity of charge q2 by the quantity corresponding to, for example, the loss in the conductive path from the charge removal unit 2 to the power storage unit 4, the internal loss in the power storage unit 4, and the loss resulting from the power storage reaction in the power storage unit 4. After that, the elongated state shown in FIG. 5 and the contracted state shown in FIGS. 6 and 7 are appropriately repeated again, in response to a request for outputting a drive force required for the dielectric elastomer drive system A2.

Figure 8:
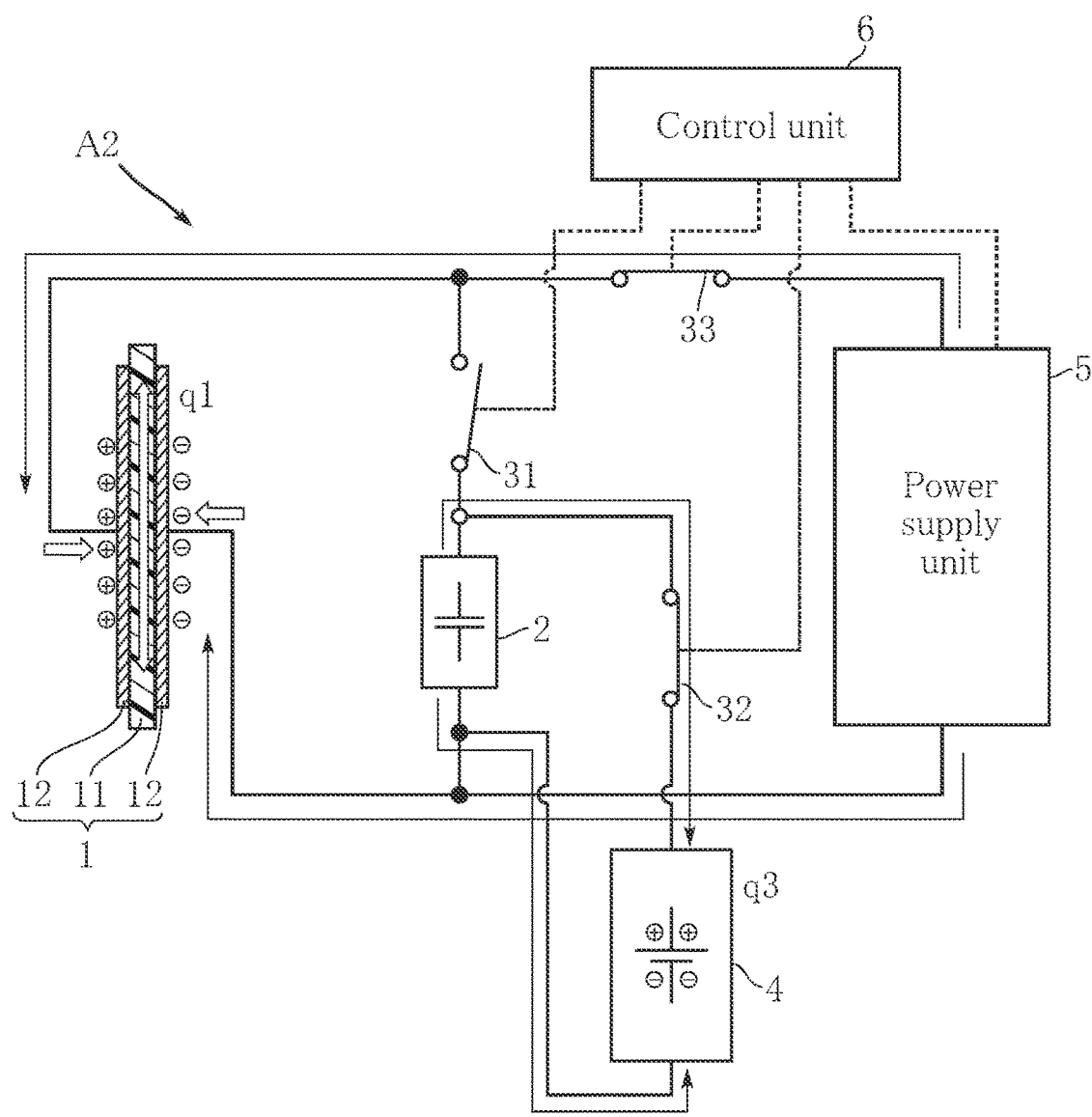
FIG. 8 is a system configuration diagram showing an operational example of the dielectric elastomer drive system according to the second embodiment of the present invention.

FIG. 8 shows another example of storing electric energy from the charge removal unit 2 to the power storage unit 4. In the present example, the sub-switch unit 32 and the switch unit 33 are closed, and the main switch unit 31 is opened by an instruction from the control unit 6. Furthermore, voltage is applied from the power supply unit 5 to the dielectric elastomer drive unit 1 by an instruction from the control unit 6. In this way, the process of storing electric energy from the charge removal unit 2 to the power storage unit 4 is performed in parallel with the operation of elongating the dielectric elastomer drive unit 1. In other words, the process of storing electric energy from the charge removal unit 2 to the power storage unit 4 can be performed either when the dielectric elastomer drive unit 1 is stopped and therefore the voltage application state thereof does not change or when the dielectric elastomer drive unit 1 is in operation and therefore the voltage application state thereof changes.

Such an embodiment as described above can also improve the responsiveness of the dielectric elastomer drive system A2. As with the charge removal unit 2 configured with a resistor, the charge removal unit 2 configured with a capacitor is suitable for promptly removing the charge q1 of the dielectric elastomer drive unit 1. Furthermore, the charge removal unit 2 functions to store the charge q1 as the charge q2, instead of converting the charge q1 to the thermal energy h1 and releasing the thermal energy h1. In this way, the charge q1 that is inputted to elongate the dielectric elastomer drive unit 1 can be reused as the charge q2, which contributes power saving.

As shown in FIG. 7, in the present embodiment, the charge removal unit 2 and the power storage unit 4 are connected to each other via the sub-switch unit 32. When the sub-switch unit 32 is closed in a state where the charge q2 is stored in the charge removal unit 2, the charge q2 of the charge removal unit 2 can be stored in the power storage unit 4. In general, the power storage unit 4 configured with a secondary battery has a much larger storage capacity than the charge removal unit 2. On the other hand, the storage speed of the power storage unit 4 is much slower than that of the charge removal unit 2 configured with the capacitor. As such, it is preferable for the charge removal unit 2 to remove the charge q1 from the dielectric elastomer drive unit 1 from the viewpoint of both improving the responsiveness and saving power, since this approach allows for maintaining the transition speed of the dielectric elastomer drive unit 1 to the contracted state at high speed and storing all the collected charge q2 in the power storage unit 4.

Third Embodiment

Figure 9:
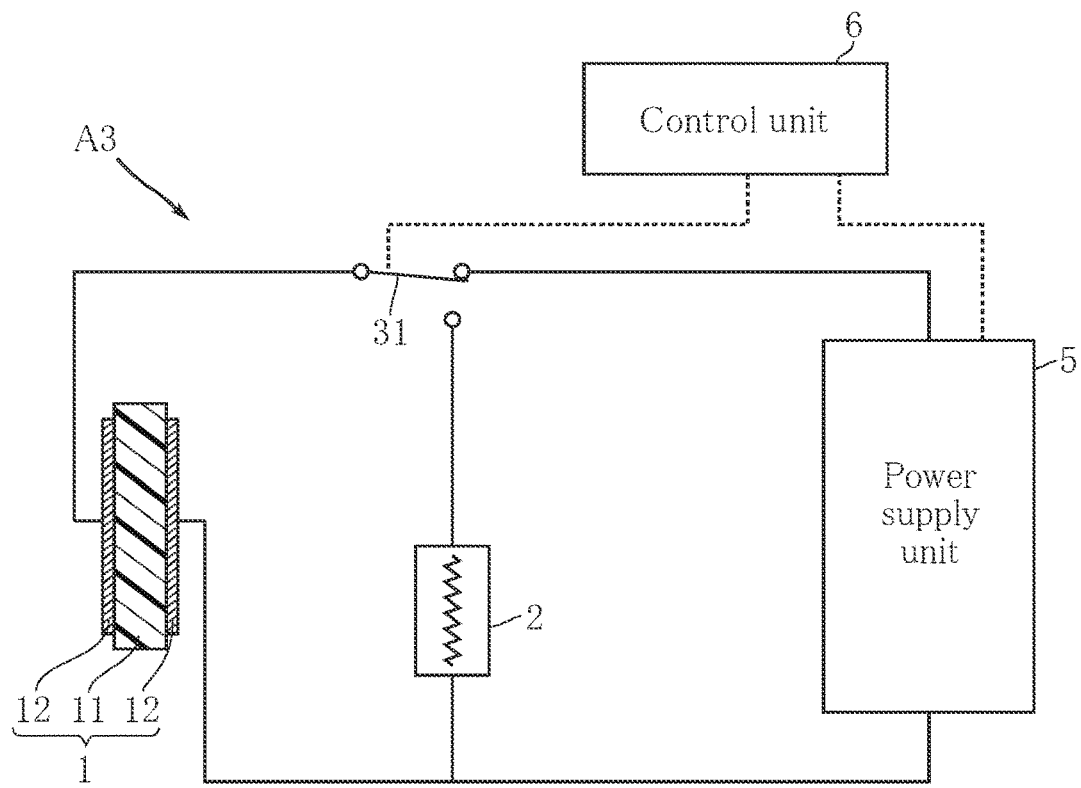
FIG. 9 is a system configuration diagram showing a dielectric elastomer drive system according to a third embodiment of the present invention.

FIG. 9 shows a dielectric elastomer drive system according to a third embodiment of the present invention. A dielectric elastomer drive system A3 according to the present embodiment is different from the dielectric elastomer drive system A1 in the configuration of the main switch unit 31 and in not having the switch unit 33, but is similar to the dielectric elastomer drive system A1 in the other configurations.

In the present embodiment, the main switch unit 31 is configured to switch between the state in which the dielectric elastomer drive unit 1 is connected to the power supply unit 5 and the state in which the dielectric elastomer drive unit 1 is connected to the charge removal unit 2. In other words, in the illustrated state, the main switch unit 31 connects the dielectric elastomer drive unit 1 and the power supply unit 5 to each other, and disconnects the dielectric elastomer drive unit 1 and the charge removal unit 2 from each other. On the other hand, when the state of the main switch unit 31 is switched from the illustrated state by an instruction from the control unit 6, the main switch unit 31 connects the dielectric elastomer drive unit 1 and the charge removal unit 2 to each other, and disconnects the dielectric elastomer drive unit 1 and the power supply unit 5 from each other. In the above example, the main switch unit 31 switches between the state in which the dielectric elastomer drive unit 1 is connected to the power supply unit 5 and the state in which the dielectric elastomer drive unit 1 is connected to the charge removal unit 2. However, in addition to the switching between these two states, the main switch unit 31 may be further configured to switch to the state in which the dielectric elastomer drive unit 1 is disconnected from both of the power supply unit 5 and the charge removal unit 2.

Such an embodiment as described above can also improve the responsiveness of the dielectric elastomer drive system A3. Furthermore, the embodiment advantageously eliminates the need for the switch unit 33 in the dielectric elastomer drive system A1.

Figure 10:
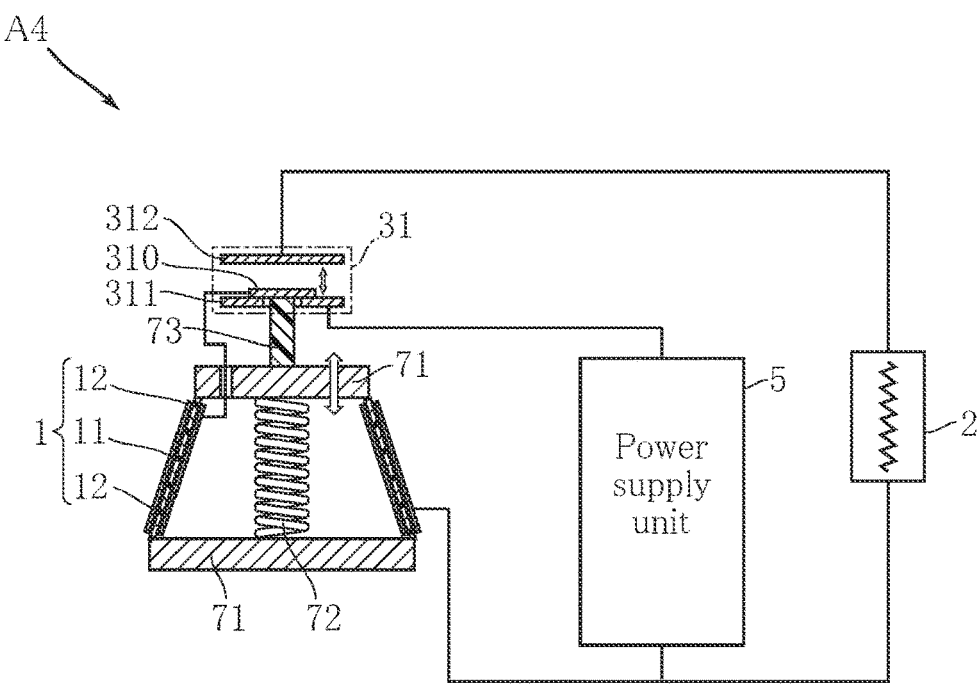
FIG. 10 is a system configuration diagram showing the dielectric elastomer drive system according to the third embodiment of the present invention.
Figure 11:
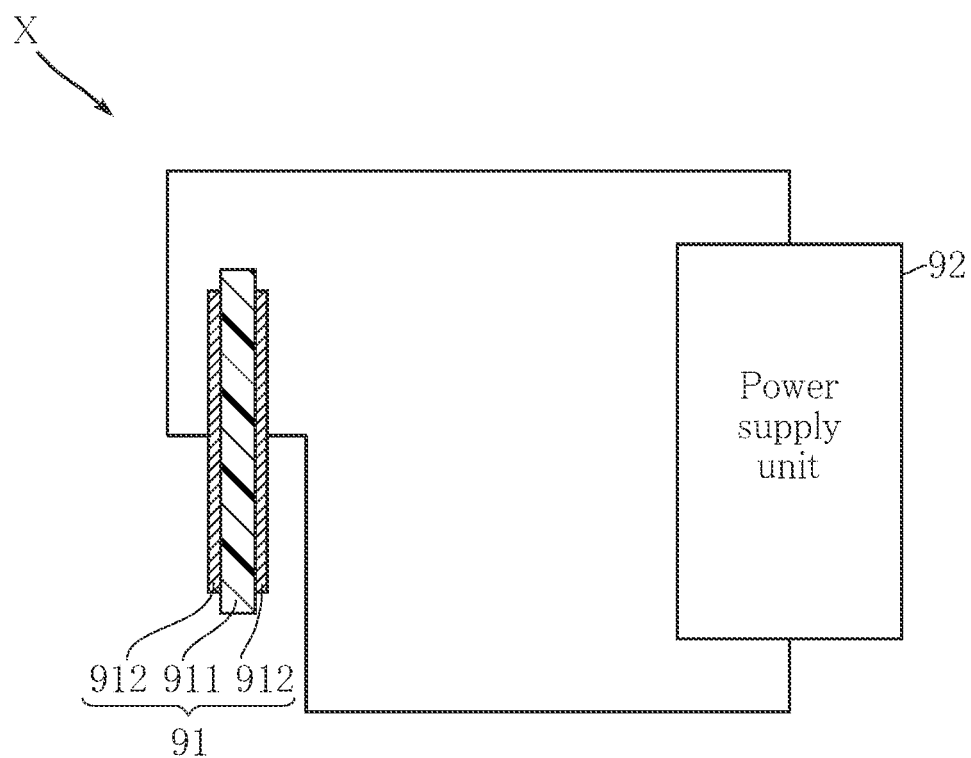
FIG. 11 is a system configuration diagram showing an example of a conventional dielectric elastomer drive system.

FIG. 10 shows a dielectric elastomer drive system according to a fourth embodiment of the present invention.

In the present embodiment, the dielectric elastomer drive unit 1 is attached to a pair of supporting members 71. The pair of supporting members 71 are circular plate-like members, for example, and have different sizes. The dielectric elastomer drive unit 1 is attached to the pair of supporting members 71, thereby having a tubular truncated-cone shape. The pair of supporting members 71 sandwich a spring 72. The spring 72 exerts an elastic force that elongates the dielectric elastomer drive unit 1 in the axial direction. Because of this, when no voltage is applied by the power supply unit 5, a tension is generated that elongates the dielectric elastomer drive unit 1 in the axial direction.

The upper supporting member 71 has a connecting rod 73 attached thereto. The connecting rod 73 moves up and down together with the upper supporting member 71 as the dielectric elastomer drive unit 1 is elongated and contracted, and transmits the movement resulting from the elongation and contraction of the dielectric elastomer drive unit 1 to the main switch unit 31.

The main switch unit 31 has a mover 310, and stators 311 and 312. One end of the connecting rod 73 is fixed to the mover 310. Accordingly, the mover 310 moves up and down as the connecting rod 73 moves up and down. The mover 310 is electrically connected to the inner electrode layer 12 of the dielectric elastomer drive unit 1. The stators 311 and 312 are separated apart from each other with the mover 310 therebetween. The stator 311 is connected to the power supply unit 5, and the stator 312 is connected to the charge removal unit 2.

In the illustrated state, the mover 310 is in contact with the stator 311, and the dielectric elastomer drive unit 1 is connected to the power supply unit 5. When the dielectric elastomer drive unit 1 is elongated in the axial direction by the application of voltage from the power supply unit 5, the upper supporting member 71, the connecting rod 73, and the mover 310 move up. This causes the mover 310 to be separated from the stator 311 to make contact with the stator 312. As a result, the dielectric elastomer drive unit 1 is disconnected (electrically cut off) from the power supply unit 5 and connected to the charge removal unit 2. In this way, the charge of the dielectric elastomer drive unit 1 is removed by the charge removal unit 2 to contract the dielectric elastomer drive unit 1. As a result, the upper supporting member 71, the connecting rod 73, and the mover 310 move down. This causes the mover 310 to be separated from the stator 312 to make contact with the stator 311 again. After that, the upper supporting member 71, the connecting rod 73, and the mover 310 repeatedly move up and down.

Such an embodiment as described above can also improve the responsiveness of a dielectric elastomer drive system A4. The dielectric elastomer drive system A4 is configured to change the state of the main switch unit 31 by the elongation and contraction of the dielectric elastomer drive unit 1. As such, the dielectric elastomer drive system A4 can cause the dielectric elastomer drive unit 1 to perform a vibrating operation by repeating elongation and contraction, without using e.g., the control unit 6 according to the above embodiments or an oscillator.

The dielectric elastomer drive system according to the present invention is not limited to the above embodiments. Various design changes can be made to the specific configurations of the elements of the dielectric elastomer drive system according to the present invention.

The invention claimed is:

1. A dielectric elastomer drive system comprising:
   a dielectric elastomer drive unit including a dielectric elastomer layer and a pair of electrode layers flanking the dielectric elastomer layer;
   a power supply unit that applies voltage to the dielectric elastomer drive unit;
   a charge removal unit that temporarily stores a charge stored in the dielectric elastomer drive unit; and
   a power storage unit that stores the charge temporarily stored in the charge removal unit; wherein
   the charge removal unit is configured with a capacitor having a capacitance larger than that of the dielectric elastomer drive unit and connected in parallel to the pair of electrode layers that removes a charge stored in the dielectric elastomer drive unit and functions as a step-down circuit that lowers voltage for charging the power storage unit with respect to voltage of the charge removal unit of when the charge is stored from the dielectric elastomer drive unit;
   the capacitor in the charge removal unit has the capacitance that is selected such that the voltage applied to the power storage unit has a desired value; and
   the system is configured to operate the power storage unit and the dielectric elastomer drive unit in parallel to allow the former to store the charge from the charge removal unit while the latter is elongated.

2. The dielectric elastomer drive system according to claim 1, further comprising a main switch unit that opens or closes a connection between the dielectric elastomer drive unit and the charge removal unit.

3. The dielectric elastomer drive system according to claim 2, further comprising a power-supply-side switch unit that opens or closes a connection between the dielectric elastomer drive unit and the power supply unit.

4. The dielectric elastomer drive system according to claim 2, wherein the main switch unit opens or closes a connection between the charge removal unit and a wiring path connecting the power supply unit and the dielectric elastomer drive unit.

5. The dielectric elastomer drive system according to claim 2, wherein the main switch unit switches between a state in which the dielectric elastomer drive unit is connected to the power supply unit and a state in which the dielectric elastomer drive unit is connected to the charge removal unit.

6. The dielectric elastomer drive system according to claim 5,
   wherein the dielectric elastomer drive unit is elongated by application of voltage in a state where the main switch unit connects the dielectric elastomer drive unit to the power supply unit, and
   the dielectric elastomer drive unit is contracted by no application of voltage in a state where the main switch unit connects the dielectric elastomer drive unit to the charge removal unit.

7. The dielectric elastomer drive system according to claim 1, further comprising a sub-switch unit that opens or closes a connection between the charge removal unit and the power storage unit.

8. A method for driving a dielectric elastomer, comprising:
   applying voltage to a dielectric elastomer drive unit including a dielectric elastomer layer and a pair of electrode layers flanking the dielectric elastomer layer;
   stopping application of voltage to the dielectric elastomer drive unit; and
   removing, with use of a charge removal unit configured with a capacitor having a capacitance larger than that of the dielectric elastomer driving unit and connected in parallel to the pair of electrode layers, a charge stored in the dielectric elastomer drive unit; wherein
   the charge removal unit functions as a step-down circuit that lowers voltage for charging a power storage unit with respect to voltage of the charge removal unit of when the charge is stored from the dielectric elastomer drive unit;
   the capacitor in the charge removal unit has the capacitance that is selected such that the voltage applied to the power storage unit has a desired value; and
   the process of storing the charge from the charge removal unit to the power storage unit and an operation of elongating the dielectric elastomer drive unit are performed in parallel.

* * * * *